United States Patent
Daubenspeck et al.

(10) Patent No.: US 6,734,047 B1
(45) Date of Patent: May 11, 2004

(54) THINNING OF FUSE PASSIVATION AFTER C4 FORMATION

(75) Inventors: Timothy H. Daubenspeck, Colchester, VT (US); Jeffrey P. Gambino, Westford, VT (US); William T. Motsiff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/065,884

(22) Filed: Nov. 27, 2002

(51) Int. Cl.[7] .............................................. H01L 21/82
(52) U.S. Cl. ...................... 438/132; 438/215; 438/281; 438/601; 438/661; 438/662
(58) Field of Search ................. 438/132, 215, 438/281, 601, 622, 661, 662, 666, FOR 433, FOR 356

(56) References Cited

U.S. PATENT DOCUMENTS

| | | | |
|---|---|---|---|
| 5,731,624 A | * | 3/1998 | Motsiff et al. ............... 257/529 |
| 5,739,045 A | * | 4/1998 | Cronin et al. ................ 438/396 |
| 5,795,819 A | * | 8/1998 | Motsiff et al. ............... 438/618 |
| 6,033,939 A | * | 3/2000 | Agarwala et al. ........... 438/132 |
| 6,093,630 A | * | 7/2000 | Geffken et al. ............. 438/612 |
| 6,249,038 B1 | | 6/2001 | Daubenspeck et al. |
| 6,294,474 B1 | | 9/2001 | Tzeng et al. |
| 6,295,721 B1 | * | 10/2001 | Tsai ............................. 29/623 |
| 6,350,668 B1 | * | 2/2002 | Chakravorty ............... 438/612 |
| 6,395,622 B1 | * | 5/2002 | Liu et al. ..................... 438/497 |
| 6,440,834 B2 | * | 8/2002 | Daubenspeck et al. ..... 438/601 |
| 6,451,681 B1 | * | 9/2002 | Greer ......................... 438/601 |
| 6,458,630 B1 | * | 10/2002 | Daubenspeck et al. ..... 438/131 |

OTHER PUBLICATIONS

Huang et al., US patent application Publication US 2002/0111009 A1, Pub. Date: Aug. 15, 2001.*
Nakatani, US patent application Publication US 2003/0030142 A1, Pub. Date: Feb. 13, 2003.*
Daubenspeck et al., US patent application Publication US 2002/0182837 A1, Pub. Date: Dec .5, 2002.*
Hagiwara et al., US patent application Publication US 2002/0105050 A1, Pub. Date: Aug. 8, 2002.*
Liu, US patent application Publication US 2003/0027379 A1, Pub. Date: Feb. 6, 2003.*

* cited by examiner

Primary Examiner—George Fourson
Assistant Examiner—Michelle Estrada
(74) Attorney, Agent, or Firm—William D. Sabo

(57) ABSTRACT

A method of forming a fuse structure in which passivating material over the fuse has a controlled, substantially uniform thickness that is provided after C4 metallurgy formation. A laser fuse deletion process for the fuse formed by this method is also disclosed.

8 Claims, 1 Drawing Sheet

THINNING OF FUSE PASSIVATION AFTER C4 FORMATION

BACKGROUND OF INVENTION

1. Technical Field

The present invention relates generally to integrated circuits having fuse elements. More particularly, the present invention relates to a method of forming a fuse structure, and to a laser fuse deletion process.

2. Related Art

Laser fusing processes are typically used to delete specific fuses formed within integrated circuits. For example, laser-blown fuses are commonly used to repair defective regions on a chip. In such processes, one approach is to fabricate the fuse in the final metal layer of a multi-layer metallization structure, with one or more overlying layers of passivating material, such as silicon oxide or silicon nitride. Thereover, a final passivating layer, usually including polyimide, is formed, and an opening is made in the final passivating layer above the fuse. During the deletion process, the fuse is exposed to a laser pulse, which heats the metal fuse above its boiling point. The subsequent volume expansion cracks the passivating material over the fuse, so that it is substantially removed allowing the metal fuse to evaporate.

In forming a multilayer metallization structure, relatively new materials are starting to be used as one or more of the dielectric layers. These materials are low-k, i.e. with dielectric constants less than about 3.5, and are generally organic as well as porous, having much lower thermal and mechanical stability as compared to conventionally used materials, such as undoped and doped silicon oxide. Because of these characteristics, these materials are not generally satisfactory as the dielectric for the final metal layer in which the fuse is fabricated, as damage to adjacent structures can result during the laser fuse deletion process. Consequently, it is generally preferable to use conventional dielectric materials for the final metal layer. Even so, damage can still occur to underlying low-k dielectric layers, due to their low thermal and mechanical stability. Therefore, in those structures in which such low-k dielectric materials are employed, the energy used in the laser fuse deletion process must be greatly reduced from that typically used for integrated circuits containing only conventional dielectric materials.

On the other hand, with a lower energy process, there is an increased risk of residual passivating material remaining over the fuse, i.e. the energy is insufficient to satisfactorily remove the passivating material. Accordingly, in such a process, the passivating material over the fuse should be as thin as possible, although thick enough to ensure that there is no oxidation or contamination of unblown fuses due to exposure to the ambient.

Also impacting the thickness of the passivating material over the fuse is the process of forming a controlled, collapse chip connection (C4) structure. A typical C4 process includes sputter cleaning and TiW etch steps tht will also reduce the thickness of the passivating material over the fuse, which can be on the order of about 100 nm, further hampering from attaining satisfactory thickness.

Therefore, there exists a need in the industry for an improved method of forming a fuse, and performing a laser deletion process, which includes effective integration with forming a C4 metallurgy structure.

SUMMARY OF INVENTION

It is against this background that the present invention provides a method of forming a fuse structure, according to which the passivating material over the fuse has a substantially uniform thickness, that is provided after forming a C4 metallurgy structure. The method is particularly suitable for multilevel-metallization structures which include low-k dielectric materials.

In accordance with the invention, there is provided a method of forming a fuse structure, comprising: providing a substrate which comprises a C4 metallurgy contact pad and a fuse therein; forming an etch resistant layer over the C4 metallurgy contact pad and the fuse; forming at least one passivating layer over the etch resistant layer; removing at least a first portion of the at least one pasivating layer and the etch resistant layer to expose the C4 metallurgy contact pad; forming a C4 metallurgy structure on the C4 metallurgy contact pad; and thereafter removing at least a second portion of the at least one passivating layer to expose the etch resistant layer over the fuse.

Further, in accordance with the invention, there is provided a method of performing a fuse deletion process, comprising: providing a substrate which comprises a C4 metallurgy contact pad and a fuse therein; forming an etch resistant layer over the C4 metallurgy contact pad and the fuse; forming at least one passivating layer over the etch resistant layer; removing at least a first portion of the at least one passivating layer and the etch resistant layer to expose the C4 metallurgy contact pad; forming a C4 metallurgy structure on the C4 metallurgy contact pad; thereafter removing at least a second portion of the at least one passivating layer to expose the etch resistant layer over the fuse; and applying a radiant energy source to the fuse until the etch resistant layer over the fuse is substantially removed.

The foregoing and other features and advantages of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1A:
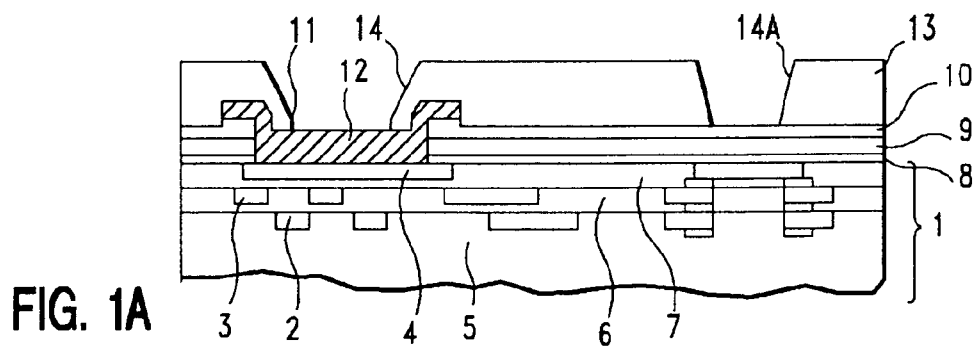
FIGS. 1A–1C are schematic section views illustrating the method in accordance with the present invention.

Referring to the drawings, and more particularly to FIG. 1A, there is shown a cross-section of a substrate 1 having several metal wiring layers formed therein. In this embodiment, the substrate 1 is illustrated with three metal wiring layers, with each having metals 2–4 embedded in respective dielectric layers 5–7. It will be understood, however, that greater or less than, three metal wiring layers, may be used in accordance with the invention. It is preferred that the final two dielectric layers 6 and 7 comprise a conventional dielectric material, such as silicon oxide or doped silicon oxide, e.g. fluorosilicate glass, to provide thermal and mechanical stability, although this is not required. However, the other dielectric layers may comprise either a conventional dielectric material or a low-k dielectric material (i.e., with a dielectric constant less than about 3.5), such as disclosed in U.S. Pat. No. 5,965,679, the entire contents of which are incorporated herein by reference. It is also preferred that metals 2–4 comprise copper, although other materials known to those skilled in the art can be employed. At least one region of the final metal wiring layer 4 forms a fuse 4A.

A plurality of passivating layers 8, 9 and 10 are deposited on the surface of the final metal wiring layer of the substrate 1. While silicon nitride, silicon oxide and silicon nitride are utilized in layers 8, 9 and 10, respectively, those skilled in the art will understand that other appropriate materials can be used. Standard photoresist and etch techniques are employed to form an opening 11 in the passivating layers 8, 9 and 10, where a C4 metallurgy structure is to be formed. A suitable material such as aluminum, titanium-tungsten, etc., is deposited in the opening 11 and etched to form a contact structure 12 on a contact pad 4 of the final metal wiring layer 4. A final layer of passivation 13, usually polyimide, is applied over the passivating layer 10 and the contact structure 12. By again using standard photoresist and etch techniques, a C4 window 14 above the contact structure 12 and a fuse window 14A above the fuse 4A are formed in the final layer of passivation 13.

Figure 1B:
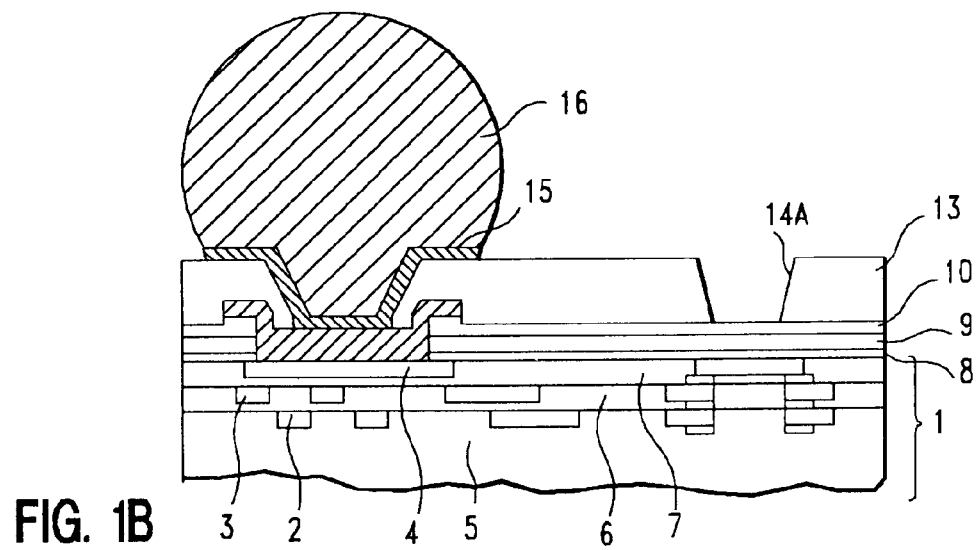

Next, a C4 metallurgy structure is formed, as shown in FIG. 1B. After carrying out a sputter cleaning process of the contact structure 12 in the C4 window 14, barrier layer metallurgy (BLM) 15 is deposited and etched, using conventional techniques. Typically, titanium-tungsten is used for the BLM. Then, the C4 metallurgy 16 comprising, for example, lead and tin, is deposited, again using standard techniques such as electroplating or, alternatively, evaporation, etc., on the remaining BLM 15.

Figure 1C:
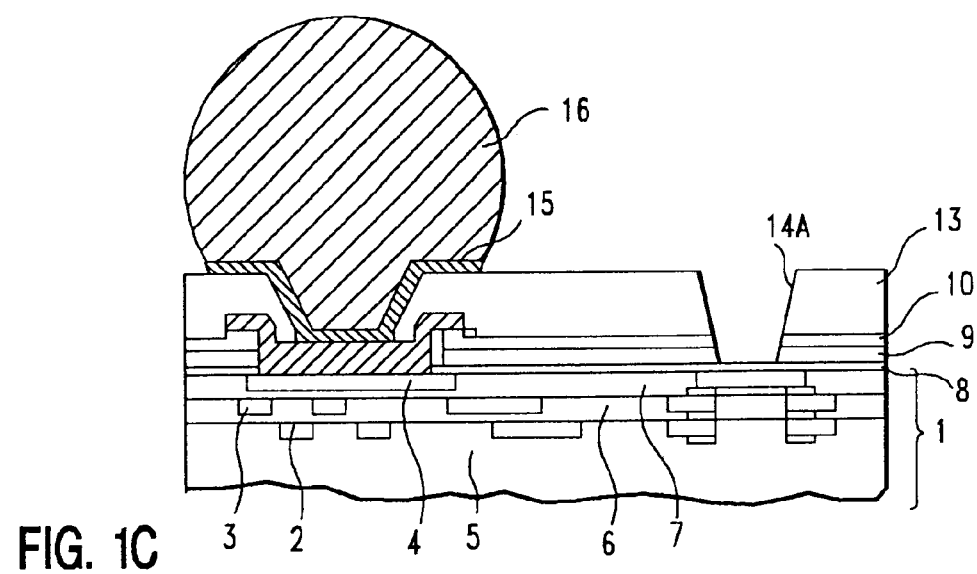

Referring to FIG. 1C, dry RIE techniques, usually fluorine-based, are used to etch passivating layer 10 selectively to passivating layer 9, i.e. silicon nitride selectively to silicon oxide in this example, above the fuse 4A. Additionally, passivating layer 9 is etched selectively to passivating layer 8, using dry RIE techniques, such as C4F8 or CHF3-based etch chemistries, to achieve high selectivity of silicon oxide to silicon nitride. It is important to control the etch of passivating layer 9 to passivating layer 8 above the fuse 4A so that it is thick enough, greater than about 75 nm for this example, to ensure that there is no oxidation or contamination of the unblown fuse 4A due to exposure to the ambient. However, at the same time, the remaining passivating layer 8 over the fuse 4A should be as thin as possible, yet ensure that low energy fuse blow is possible, which in this example would be less than about 150 nm. For manufacturing efficiency, it should be noted that these two etches can be combined with the BLM etch.

To eliminate or reduce potential contamination from these etch steps, it may be desirable to perform additional cleaning of the C4 metallurgy 16 and the surface of the final layer of passivation 13. Otherwise, contamination may degrade adhesion between the C4 metallurgy 16 and the package (not shown). As examples, an oxygen-ashing or sputter cleaning can be used to clean the surface of polyimide, and a hydrogen reflow anneal can be used to clean the surface of the C4 metallurgy 16, especially if there is oxidation of the surface from an oxygen-ashing process.

Further, in accordance with the method of the invention, it should be emphasized that the passivating layers 9 and 10 over the fuse 4A are etched after the C4 metallurgy 16 is formed. Otherwise, steps which are carried out during the C4 process, such as sputter cleaning and the BLM 115 etch, will also etch the passivating layer 8 over the fuse 4A. In practice, these C4 process steps can etch the passivating layer 8 by varying amounts, but as much as about 100 nm or more would be possible. Such variation would make it difficult to achieve the desired thickness of passivating layer 8 over the fuse 4A. By etching passivating layers 9 and 10 over the fuse 4A after C4 metallurgy 4 formation, the variability in passivating layer 8 thickness is greatly reduced.

The resulting fuse structure is shown in FIG. 1C, which is now ready for fuse blow. Further in accordance with the invention, a laser deletion process is performed to open the fuse 4A. In particular, a radiant energy source is applied to the fuse 4A until the passivating layer 8 over the fuse 4A is substantially removed. In a particularly preferred embodiment, an infra-red laser emits a beam, with specified amount of energy, through the remaining thickness of the passivating layer 8 over the fuse 4A and into the fuse 4A. As the laser beam interacts with the fuse 4A material, the fuse 4A heats up and expands, so as to cause the passivating layer 8 over the fuse 4A to rupture. Following rupture, the molten metal of fuse 4A vaporizes so that fuse delete occurs.

While this invention has been described in conjunction with the specific embodiments outlined above, it is evident that many alternatives, modifications and variations will be apparent to those skilled in the art. For example, it is important that the passivating layer 8 has a slower etch rate than the passivating layer 9 deposited over it, so that it provides etch resistant or etch stop characteristics, but other materials than those described can be used as long as these characteristics are provided. Similarly, although metals 2–4 are copper in the described embodiments, it is not necessary to use the same metal for all metal wiring layers, nor to necessarily use copper, although it is preferred. In addition, a wide variety of etch techniques, both dry and wet, and cleaning techniques, can be employed so that these steps are in no way limited to only those described. Also, although the metal wiring layers are preferably formed using damascene processing, other types of processing can be employed. Also, as previously noted, the invention is not limited to the specific number of layers shown. For example, the number of metal wiring layers or the number of passivating layers above the final wiring layer may be greater or less than those shown, and so forth. Accordingly, the embodiments of the invention as set forth above are intended to be illustrative, not limiting. Various changes may be made without departing from the spirit and scope of the invention as defined in the following claims.

What is claimed is:

1. A method of performing a fuse deletion process, comprising:

providing a substrate which comprises a C4 metallurgy contact pad and a fuse therein, wherein said substrate comprises a plurality of metal wiring layers and a plurality of dielectric layers; and said C4 metallurgy contact pad and said fuse are formed within the final metal wiring layer;

forming an etch resistant layer over said C4 metallurgy contact pad and said fuse;

forming at least one passivating layer over said etch resistant layer;

removing at least a first portion of said at least one passivating layer and said etch resistant layer to expose said C4 metallurgy contact pad;

forming a C4 metallurgy structure on said C4 metallurgy contact pad, wherein said step of forming a C4 metallurgy structure includes depositing a BLM over said at least one passivating layer and said exposed C4 metallurgy contact pad; etching said BLM; and forming a C4 solder bump on the remaining etched BLM;

thereafter, removing at least a second portion of said at least one passivating layer to expose said etch resistant layer over said fuse;

wherein said step of etching said BLM is carried out at the same time as said step of removing at least a second portion of said at least one passivating layer; and applying a radiant energy source to said fuse until said etch resistant layer over said fuse is substantially removed.

2. The method of claim 1, wherein said plurality of dielectric layers comprise a low-k organic material, a fluorosilicate glass or silicon oxide.

3. A method of performing a fuse deletion process, comprising:

providing a substrate which comprises a C4 metallurgy contact pad and a fuse therein, wherein said substrate comprises a plurality of metal wiring layers and a plurality of dielectric layers; and said C4 metallurgy contact pad and said fuse are formed within the final metal wiring layer, wherein said plurality of dielectric layers comprise a low-k organic material, a fluorosilicate glass or silicon oxide;

wherein said substrate comprises at least five metal layers; and each of said dielectric layers comprises a low-k organic material, a fluorosilicate glass or silicon oxide;

forming an etch resistant layer over said C4 metallurgy contact pad and a fuse;

forming at least one passivating layer over said etch resistant layer;

removing at least a first portion of said at least one passivating layer and said etch resistant layer to expose said C4 metallurgy contact pad;

forming a C4 metallurgy structure on said C4 metallurgy contact pad;

thereafter, removing at least a second portion of said at least one passivating layer to expose said etch resistant layer over said fuse; and applying a radiant energy source to said fuse until said etch resistant layer over said fuse is substantially removed.

4. The method of claim 3, wherein said etch resistant layer provides a substantially uniform passivation thickness over said fuse.

5. The method of claim 4, wherein said substantially uniform passivation thickness is of sufficient thickness as to ensure fuse deletion and to ensure substantially no contamination of said fuse before deletion due to exposure to the ambient.

6. The method of claim 5, wherein said etch resistant layer comprises silicon nitride.

7. The method of claim 6, wherein said etch resistant layer has a thickness of about 75 to about 150 nm.

8. The method of claim 3, wherein said step of applying a radiant energy source comprises emitting a laser beam.

* * * * *